(12) United States Patent
Prentice et al.

(10) Patent No.: US 6,814,810 B2
(45) Date of Patent: Nov. 9, 2004

(54) APPARATUS FOR CALIBRATING A DISPENSING SYSTEM

(75) Inventors: Thomas C. Prentice, Westford, MA (US); Brian P. Prescott, Fremont, NH (US); Charles J. Zaverson, Hudson, NH (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/928,112

(22) Filed: Aug. 10, 2001

(65) Prior Publication Data

US 2002/0020350 A1 Feb. 21, 2002

Related U.S. Application Data

(63) Continuation-in-part of application No. 09/705,080, filed on Nov. 2, 2000, now Pat. No. 6,541,063.
(60) Provisional application No. 60/163,517, filed on Nov. 4, 1999.

(51) Int. Cl.⁷ ............................................. B05C 11/00
(52) U.S. Cl. .................. 118/677; 118/712; 156/356; 222/55; 73/1.74; 73/1.73; 73/149; 73/150 R; 73/150 A
(58) Field of Search ........................... 118/677, 712, 118/664; 73/1.73, 1.74, 149, 150 R, 150 A; 222/55; 356/635, 627; 156/356; 177/262

(56) References Cited

U.S. PATENT DOCUMENTS

| | | | |
|---|---|---|---|
| 3,828,869 A | 8/1974 | Sellers | 177/50 |
| 3,894,591 A | * 7/1975 | Ackeret | 177/126 |
| 3,994,256 A | 11/1976 | Moen | 118/3 |
| 4,038,531 A | 7/1977 | Loe, Jr. | 235/151.1 |
| 4,054,784 A | 10/1977 | Ricciardi et al. | 364/479 |
| 4,095,723 A | 6/1978 | Lerner | 222/56 |
| 4,234,102 A | 11/1980 | Spurgeon | 222/55 |
| 4,271,092 A | 6/1981 | Sullivan et al. | 261/30 |
| 4,330,354 A | 5/1982 | Deubner et al. | 156/352 |
| 4,345,858 A | 8/1982 | Barlow | 406/34 |
| 4,406,247 A | 9/1983 | Baughman et al. | 118/684 |
| 4,431,690 A | 2/1984 | Matt et al. | 427/424 |
| 4,467,844 A | 8/1984 | Di Gianfilippo et al. | 141/1 |
| 4,470,369 A | 9/1984 | Edgerton | 118/723 |
| 4,580,698 A | 4/1986 | Ladt et al. | 222/55 |
| 4,589,372 A | 5/1986 | Smith | 119/51 R |
| 4,620,893 A | 11/1986 | Parrens | 156/345 |
| 4,666,732 A | 5/1987 | Schucker | 427/8 |
| 4,667,852 A | 5/1987 | Siemann | 222/54 |
| 4,682,710 A | 7/1987 | Turner, Jr. et al. | 222/63 |
| 4,682,711 A | 7/1987 | Reighard et al. | 222/75 |

(List continued on next page.)

FOREIGN PATENT DOCUMENTS

WO  WO 97/13586  4/1997

OTHER PUBLICATIONS

PCT International Search Report dated Feb. 20, 2001.

Primary Examiner—Richard Crispino
Assistant Examiner—George R. Koch, III
(74) Attorney, Agent, or Firm—Lowrie, Lando & Anastasi, LLP

(57) ABSTRACT

The present invention is directed to methods and apparatus for accurately controlling the quantity of material dispensed from dispensing systems. In one aspect of the present invention, a dispensing system includes a calibration system, which collects and measures an amount of material dispensed during a calibration routine. The calibration dispensing pattern and the amount of material dispensed from the dispensing system during the calibration routine are representative of an actual dispensing pattern. The measured amount of material collected during the calibration routine is compared with a target quantity. The dispensing system is adjusted if the difference between the quantity of collected material and the target quantity is greater that a predetermined tolerance.

11 Claims, 3 Drawing Sheets

U.S. PATENT DOCUMENTS

| | | | | |
|---|---|---|---|---|
| 4,787,332 A | | 11/1988 | Geisel et al. | 118/692 |
| 4,796,782 A | | 1/1989 | Wales et al. | 222/57 |
| 4,836,315 A | * | 6/1989 | Lee | 177/247 |
| 4,878,522 A | | 11/1989 | Ostrander | 141/1.1 |
| 4,891,249 A | | 1/1990 | McIntyre | 427/421 |
| 4,893,262 A | | 1/1990 | Kalata | 364/567 |
| 4,913,198 A | | 4/1990 | Hayahara et al. | 141/83 |
| 4,935,261 A | | 6/1990 | Srivastava et al. | 427/10 |
| 4,967,933 A | | 11/1990 | Maiorca et al. | 222/1 |
| 4,987,854 A | | 1/1991 | Hall | 118/679 |
| 5,042,688 A | | 8/1991 | Srivastava et al. | 222/55 |
| 5,052,338 A | | 10/1991 | Maiorca et al. | 118/668 |
| 5,065,695 A | | 11/1991 | Baron et al. | 118/688 |
| 5,110,615 A | | 5/1992 | Maiorca et al. | 427/8 |
| 5,116,634 A | | 5/1992 | Havens et al. | 427/4 |
| 5,148,841 A | | 9/1992 | Graffin | 141/83 |
| 5,175,018 A | | 12/1992 | Lee et al. | 427/8 |
| 5,208,064 A | | 5/1993 | Becker et al. | 427/8 |
| 5,263,608 A | | 11/1993 | Kiernan et al. | 222/1 |
| 5,271,521 A | | 12/1993 | Noss et al. | 222/1 |
| 5,320,250 A | | 6/1994 | La et al. | 222/1 |
| 5,322,706 A | | 6/1994 | Merkel et al. | 427/8 |
| 5,332,125 A | | 7/1994 | Schmitkons et al. | 222/1 |
| 5,348,604 A | | 9/1994 | Neff | 156/272.8 |
| 5,375,634 A | | 12/1994 | Egger | 141/83 |
| 5,377,868 A | | 1/1995 | Hernandez et al. | 222/1 |
| 5,413,154 A | | 5/1995 | Hurst, Jr. et al. | 141/83 |
| 5,423,455 A | | 6/1995 | Ricciardi et al. | 222/1 |
| 5,423,456 A | | 6/1995 | Arendonk et al. | 222/54 |
| RE35,010 E | | 8/1995 | Price | 222/1 |
| 5,437,727 A | | 8/1995 | Yoneda et al. | 118/669 |
| 5,465,879 A | | 11/1995 | La et al. | 222/189.06 |
| 5,487,603 A | | 1/1996 | Hoff et al. | 366/141 |
| 5,505,777 A | | 4/1996 | Ciardella et al. | 118/663 |
| 5,510,149 A | | 4/1996 | Schucker | 427/421 |
| 5,515,888 A | | 5/1996 | Graffin | 141/1 |
| 5,523,101 A | | 6/1996 | Fitch, Jr. | 426/289 |
| 5,554,224 A | | 9/1996 | Foltyn | 118/725 |
| 5,558,504 A | | 9/1996 | Stridsberg | 417/322 |
| 5,570,731 A | | 11/1996 | Muscara | 141/83 |
| 5,632,411 A | | 5/1997 | Harty et al. | 222/1 |
| 5,636,118 A | | 6/1997 | Brewster et al. | 395/229 |
| 5,665,941 A | | 9/1997 | Wehhofer et al. | 177/25.13 |
| 5,711,989 A | | 1/1998 | Ciardella et al. | 427/96 |
| 5,718,268 A | | 2/1998 | Muscara | 141/87 |
| 5,837,892 A | | 11/1998 | Cavallaro et al. | 73/149 |
| 5,857,589 A | | 1/1999 | Cline et al. | 222/1 |
| 5,906,682 A | * | 5/1999 | Bouras et al. | 118/712 |
| 5,932,062 A | * | 8/1999 | Manser | 156/357 |
| 5,978,093 A | | 11/1999 | Abrahamson | 356/401 |

* cited by examiner

APPARATUS FOR CALIBRATING A DISPENSING SYSTEM

RELATED APPLICATIONS

This application is a continuation in part (CIP) of U.S. patent application Ser. No. 09/705,080, filed Nov. 2, 2000, now U.S. Pat. No. 6,541,063, which claims priority to U.S. Provisional Application No. 60/163,517, filed Nov. 4, 1999, both of which are incorporated herein by reference.

FIELD OF THE INVENTION

The present invention relates generally to a method and apparatus for controlling the operation of a liquid dispensing system, and more particularly, to a method and apparatus for measuring and controlling the amount of viscous material dispensed from a dispensing system.

BACKGROUND OF THE INVENTION

There are several types of prior art dispensing machines used for dispensing metered amounts of liquid or paste for a variety of applications. One such application is in the assembly of surface mount printed circuit boards, wherein adhesive liquid is dispensed in precise, predetermined locations on a circuit board. The adhesive liquid is used for connecting components to the circuit board. Another application of dispensing machines is in dispensing viscous material used for encapsulating integrated circuit chips and/or for under filling flip integrated circuit chips. The dispensing machines are generally required to run continuously to achieve a high throughput, and are also required to achieve a high degree of accuracy and repeatability (i.e., be able to dispense substantially identical dots with a very small tolerance or variability between dots). The dispensing systems described above include those manufactured by Speedline Technologies, Inc., the assignee of the present invention, and distributed under the name XYFLEX™.

As semiconductor packaging technology advances, so too does the need for better and more accurate fluid dispensing technology to support this application. Manufacturers who use dispensing systems to encapsulate and underfill any of a variety of semiconductor packages demand ever more accurate and repeatable means for controlling the dispensing process. In one prior art dispensing system, a scale periodically measures the weight of material dispensed by the system during calibration routines, and the dispensing system includes a feedback system to adjust the quantity of fluid dispensed by the dispensing system, so that the weight of the material dispensed is controlled.

In the prior art dispensing systems that employ a calibrations system, the dispensed material used for calibration must be collected during the calibration routine. The collected material is normally not reusable and therefore must be disposed of. Often, the adhesive, solder paste, encapsulant, epoxy or other media that is being dispensed onto the substrate in these dispensing systems is toxic or otherwise not immediately disposable in a liquid state and must be cured prior to disposal.

In some prior art dispensing systems, such as that disclosed in U.S. Pat. No. 5,906,682 to Bouras et. al, which is incorporated herein by reference, the addition of a weight scale to the dispensing process improves the accuracy and repeatability of the process by measuring the actual material flow rate being achieved, and adjusting the dispenser's traverse speed as necessary to compensate for any long term variations. Inherent in this approach is the assumption that the flow rate is constant over the short term. However, in reality, fluid flow is seldom constant. Certainly the steady state material delivery rate cannot be achieved instantaneously, nor can the positioning system be accelerated or decelerated instantaneously. These nonlinear transitions result in discrepancies between predicted and actual material amounts.

In embodiments of the present invention, to overcome these shortcomings, a different approach has been taken; the presence of these nonlinearities is acknowledged and their effects is captured by duplicating them during weight scale sample dispensing. Additionally, a system is provided for properly collecting and disposing of the material dispensed during a calibration routine.

SUMMARY OF THE INVENTION

In one aspect, the present invention is directed to a system for dispensing material onto a substrate. The system includes a dispensing element having a metering device that controls a quantity of material dispensed from the dispensing element, a positioning system coupled to the dispensing element to move the dispensing element over the substrate in a dispensing pattern, a calibration device having a dish that receives material from the dispensing element during a calibration routine of the dispensing system and a controller, coupled to the positioning system, the dispensing element and the calibration device to control operation of the dispensing system, wherein the controller is constructed and arranged to control the positioning system and the dispensing element such that the dispensing element is moved and controlled according to a calibration pattern to dispense material into the dish during a calibration routine, and wherein the calibration pattern is representative of the dispensing pattern.

The system may be constructed and arranged such that the dish is removably connected to the calibration device. The dish may be constructed and arranged to include a tab for conveying the dish to or from the calibration device. The dish may be constructed and arranged to include a protuberance for operatively removing an amount of material from dispensing element. The dish may be constructed and arranged to be disposable. The dish may be constructed and arranged to withstand a temperature that will allow any dispensed material collected in the dish to cure. The dish may be constructed and arranged from a generally conductive material.

The calibration device may be constructed and arranged to determine a quantity of material dispensed during a calibration routine, and the quantity may be compared with a target quantity of material to determine an error value. The controller may be constructed and arranged to apply a scale factor to the dispensing pattern to obtain the calibration pattern to reduce the distance traveled by the pump during the calibration routine to maintain the pump over the calibration device. The scale factor may be applied to the speed of movement of the dispensing system during a calibration routine such that the material dispensed during a calibration routine is substantially the same as that dispensed onto a substrate. The system may be constructed and arranged to adjust a rate of delivery of the metering device when the error value is greater than a predefined value. The system may be constructed to adjust a speed of movement of the pump when the error value is greater than a predefined value. The system may be constructed and arranged such that the calibration pattern is the same as the dispensing pattern.

Another aspect of the present invention is directed to a method of calibrating a dispensing system that dispenses material onto a substrate according to a dispensing pattern, the dispensing system having a dispensing pump that dispenses material and a gantry system that controls movement of the pump over the substrate and over a calibration system. The method includes steps of (a) moving the pump over the calibration system, (b) dispensing a quantity of material from the pump while the pump is moved by the gantry system according to a calibration pattern that is representative of the dispensing pattern, (c) collecting the dispensing material in a dish, (d) determining the quantity of material dispensed, (e) comparing the quantity of material dispensed with a target quantity, and (f) adjusting characteristics of the dispensing system when a difference between the quantity of material dispensed and the target quantity is greater than a predetermined tolerance.

Steps (a) through (f) may be repeated prior to dispensing on a substrate until the difference is less than the tolerance. The method may further include the step of removing, disposing and or replacing the dish after step (f). The material collected in the dish may be cured prior to the dish being disposed of. The method may further include a step of applying a scaling factor to the dispensing pattern to reduce the distance traveled by the pump to maintain the pump over the calibration system during a calibration routine. The scaling factor may be applied to the gantry system to reduce the speed of movement of the pump during a calibration routine such that the material dispensed during a calibration routine is substantially the same as that dispensed onto a substrate.

Another aspect of the present invention is directed to a system for dispensing a material onto a substrate. The system includes a dispensing element having a metering device that controls a quantity of material dispensed from the dispensing element, a positioning system coupled to the dispensing element to move the dispensing element over the substrate in a dispensing pattern, a calibration device having a dish that receives material from the dispensing element during a calibration routine of the dispensing system, means for moving the dispensing element according to a calibration pattern that is representative of the dispensing pattern to dispense material onto the calibration device during a calibration routine and means for determining a quantity of material dispensed during a calibration routine.

The system may further include means for determining a difference between the quantity of material dispensed with a target quantity and means for adjusting characteristics of the system to reduce the difference. The system may further include means for applying a scaling factor to the system to reduce the distance traveled by the dispensing element during the calibration routine. The system may further include a weight scale for measuring the weight of material dispensed.

Yet another aspect of the present invention is directed to a method of calibrating a dispensing system that dispenses material onto a substrate according to a dispensing pattern, the dispensing system having a dispensing pump that dispenses material and a gantry system that controls movement of the pump over the substrate and over a calibration system having a dish. The method includes steps of (a) moving the pump over the dish of the calibration system, (b) pre-dispensing a quantity of material into the dish, (c) zeroing out the calibration system, (d) dispensing a quantity of material from the pump while the pump is controlled to follow a calibration pattern that is representative of the dispensing pattern, (e) collecting the quantity of material dispensed from the pump during the calibration pattern in the dish, (f) measuring the amount of material collected in the dish during steps (d) and (e), (g) comparing the amount of measured material in step (f) with a target quantity and (h) adjusting characteristics of the dispensing system when a difference between the measured material and the target quantity is greater than a predetermined tolerance. Steps (c) through (h) may be repeated prior to dispensing on a substrate until the difference is less than the tolerance.

Yet another aspect of the present invention is directed to a method of calibrating a dispensing system that dispenses material onto a substrate according to a dispensing pattern, the dispensing system having a dispensing pump that dispenses material and a gantry system that controls movement of the pump over the substrate and over a calibration system, the calibration system having a dish for collecting a quantity of dispensed material, the dish having a protuberance. The method includes steps of (a) moving the pump over the dish of the calibration system, (b) pre-dispensing a quantity of material from the dispensing system to create a tail of material, (c) dislodging the tail of material from the dispensing system by moving the pump over the protuberance of the dish such that the tail of material contacts the protuberance, (d) collecting the dislodged tail of material in the dish, (e) zeroing the calibration system, (f) dispensing a quantity of material from the pump while the pump is controlled to follow a dispensing calibration pattern that is representative of the dispensing pattern, (g) collecting the dispensed quantity of material from the pump in the dish, (h) dislodging a tail of material from the dispensing system by moving the pump over the protuberance of the dish such that the tail of material contacts the protuberance, (i) collecting the dislodged tail of material in the dish, (j) determining the quantity of material collected in the dish during steps (e) through (i), (k) comparing the quantity of material dispensed with a target quantity and (l) adjusting characteristics of the dispensing system when a difference between the quantity of material dispensed and the target quantity is greater than a predetermined tolerance. Steps (e) through (l) may be repeated prior to dispensing on a substrate until the difference is less than the tolerance.

BRIEF DESCRIPTION OF THE DRAWINGS

For a better understanding of the present invention, reference is made to the drawings that are incorporated herein by reference and in which.

DETAILED DESCRIPTION

For purposes of illustration only, and not to limit generality, the present invention will now be explained with reference to a dispensing system used to dispense an adhesive, solder paste, an encapsulant or some other medium onto a substrate such as a circuit board or an integrated circuit chip. One skilled in the art will appreciate, however, that embodiments of the present invention are not limited to dispensing systems, but rather, the measuring and control apparatus in accordance with embodiments of the present invention may be used in other applications requiring precise, weight or volume measurements of small quantities of viscous materials. Additionally, it is contemplated that the quantity of material collected for measurement may be determined by methods other than weighing the material, such as by measuring its volume.

Figure 1:
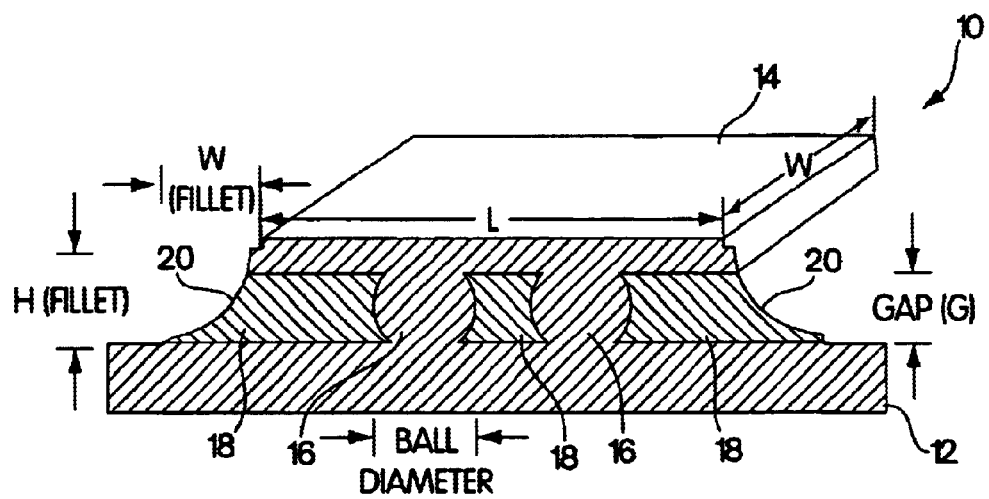
FIG. 1 is a cross-sectional view of a flip chip integrated circuit.

FIG. 1 shows a cross-sectional view of a flip chip integrated circuit 10 having a substrate 12 and a die 14. A number of solder balls 16 are disposed between the substrate and the die of the integrated circuit to provide electrical connections between the die and the substrate. Underfill material 18 is disposed in the gap between the die 14 and the substrate 12 around all of the balls 16, and a fillet of underfill material 20 is disposed on the substrate around the perimeter of the die 14. To provide the underfill material to a flip chip integrated circuit, it is known to lower a pump of a dispensing system in close proximity to the flip chip integrated circuit, and to dispense underfill material from a dispensing needle of the pump onto the substrate as the pump is moved around the perimeter of the flip chip. The dispensed underfill material will then seep under the flip chip.

The total volume V of underfill material required to properly fill the gap and provide the fillet around the perimeter of the die can be determined using equation (1) below:

$$V = V_c - V_b + V_f \qquad 1$$

where:

$V_c$ = the volume of the gap between the die and the substrate;

$V_b$ = the total volume of all the solder balls; and $V_f$ = the volume of the fillet.

In one typical application, Vc is approximately equal to 22.58 mm³, Vb is approximately equal to 0.30³, and Vf is approximately equal to 0.50 mm³, so that the total volume V of underfill material is equal to approximately 22.78 mm³. For the typical application described above, to properly underfill the integrated circuit 10, it is desirable to dispense precisely 22.78 mm³ of underfill material from a dispensing system. This desired volume may be converted to a desired weight by multiplying by the material's density. Weight and volume calibration systems have been incorporated into prior art dispensing systems to periodically calibrate the dispensing system to ensure that the proper amount of material is being dispensed.

In one prior art dispensing system, the weight of material dispensed is determined for a fixed period of time, and a dispense rate (in terms of weight per unit time) is determined. For example, the operator of a dispensing system sets up a sample dispense routine as N shots, of M seconds each, with P seconds of pause between shots (e.g. 15 shots of 1 sec each, with 0.5 sec pauses. The total amount dispensed is weighed and divided by the total on time of the pump (e.g. 187.5 mg/15 sec=12.5 mg/sec). This measurement is then used to calculate other control parameters for the dispenser. For example, since the system "knows" the target weight of the pattern to be dispensed (e.g. 100 mg), the on time of the valve may be determined. (e.g. 100 mg/(12.5 mg/sec)=8 sec). Furthermore, since the distance to be traversed is known (e.g. 20 mm), the average traverse rate can be calculated (e.g. 20 mm/8 sec=2.5 mm/sec). This value can then be used to control the gantry speed and therefore the speed at which the pump traverses the perimeter of the flip chip.

One problem of the above-described system is that it fails to account for non-linearities in the dispense rate and the gantry speed that occur as the pump and the movement of the gantry are started and stopped. This problem is particularly significant for encapsulant dispensing of flip chips, wherein both the pump and the gantry are started and stopped a number of times as the pump is traversed around the perimeter of the flip chip. During flip chip dispensing, the pump may never reach the full dispense rate, and the gantry may never reach the full traverse speed. Embodiments of the present invention, which will now be described, provide dispensing systems having novel calibration systems that overcome these problems with the prior art.

Figure 2:
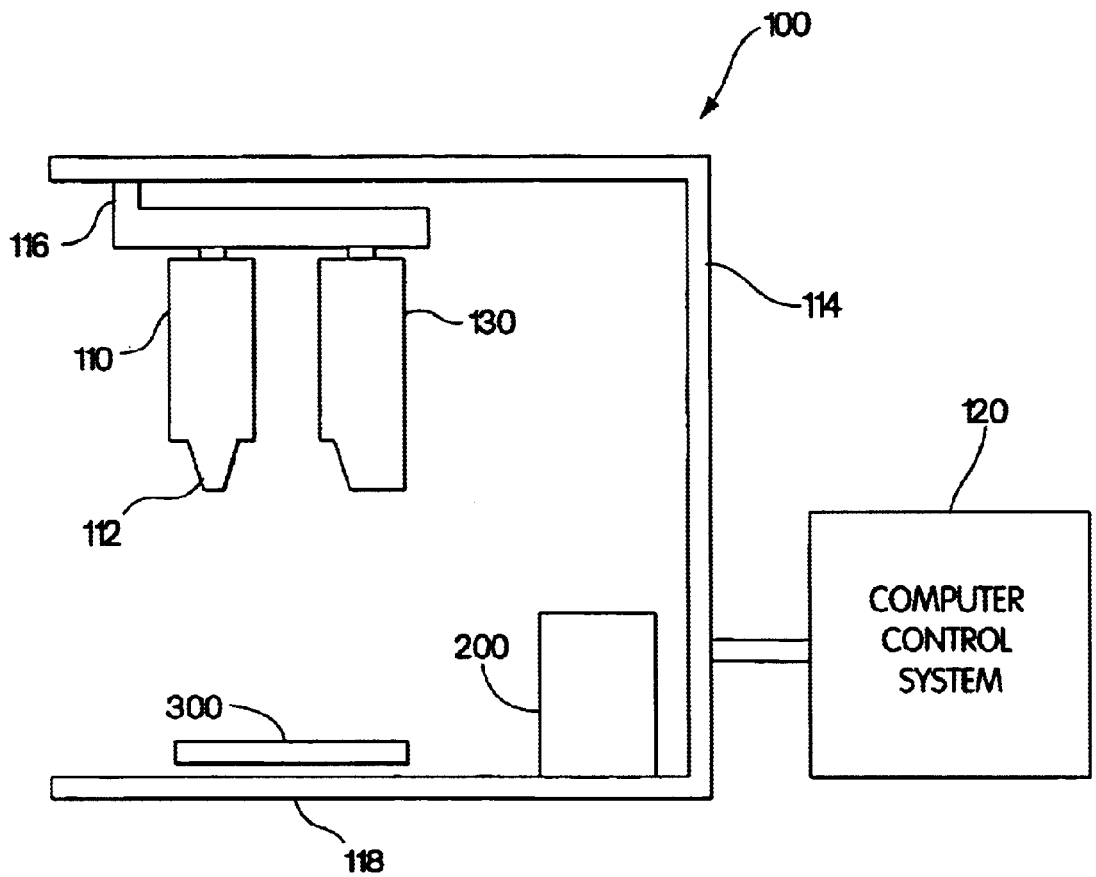
FIG. 2 is a drawing of a dispensing system in accordance with one embodiment of the present invention.

FIG. 2 shows a liquid dispensing system 100 in accordance with one embodiment of the present invention for dispensing materials including underfill material. The liquid dispensing system 100 includes a pump and dispenser assembly 110, a computer control system 120, a vision system 130, and a weight measuring apparatus 200. The liquid dispensing system 100 has a frame 114 having a lower substrate 118 for supporting a circuit board 300 or some other substrate that is to receive material dispensed by the pump and dispenser assembly 110. The pump and dispenser assembly 110 and the vision system 130 are coupled to an arm 116, which in turn is movably coupled to the frame 114 of the dispensing system 100. The arm 116 can be moved, using motors (not shown), under the control of the computer control system, in X, Y and Z directions, to locate the pump and dispenser assembly 110 and the vision system 130 at predetermined locations and heights over the circuit board 300 and the weight measuring apparatus 200.

The dispensing system 100 operates as follows. The circuit board 300, or some other substrate that is to receive material dispensed from the dispensing system, is placed on the base 118 of the dispensing system. The circuit board 300 may be placed on the base manually, or in a preferred embodiment, a conveyor system is used for loading circuit boards or other substrates into the dispensing system 100. The base 118 may also include a vacuum lift table for securing the board 300 to the base 118 during the dispensing operation, and may also include a heater to maintain the circuit board and dispensed material at a desired temperature.

The pump and dispenser assembly 110 dispenses drops and/or patterns of material through a nozzle 112 at predetermined points on the circuit board 300. The dispensing material is stored in a container (not shown), coupled to the pump and dispenser assembly, at a controlled pressure. The system may further control the temperature of the material supply. In a preferred embodiment, the pump and dispenser assembly includes a rotary type pump having a metering device that includes an auger within an auger chamber. The auger is precisely turned within the auger chamber to dispense metered quantities of liquid. In the present embodiment, the quantity of material dispensed for a given rotary type pump is controlled by setting the revolutions per minute (RPM) of the auger and the dispensing time of the pump. In other embodiments, a servomechanism controls the pump and an encoder determines and controls the auger position. In one embodiment of the present invention, the auger and auger chamber are implemented as described in U.S. Pat. No. 5,819,983 entitled "Liquid Dispensing System With Improved Sealing Auguring Screw and Method For Dispensing", assigned to the assignee of the present invention, and incorporated herein by reference. In other embodiments, other pumps may be used, such as those described in U.S. Pat. No. 5,957,343, and U.S. patent application Ser. No. 09/483,360, both of which are assigned to the assignee of the present application and incorporated herein by reference.

The computer control system 120 controls motors (not shown) to move the arm 116 in the X, Y, and Z directions to properly position nozzle 112 of the pump and dispenser assembly 110 over the circuit board to ensure that dispensing occurs at the predetermined points on the circuit board. In one embodiment a well-known X-Y gantry system is used to control the position of the pump in the X-Y plane. In other embodiments, other gantry systems, such as those described in U.S. Pat. No. 5,886,494 entitled Positioning System, which is incorporated herein by reference, may be used. The computer control system is pre-programmed with a desired material dispense pattern for the circuit board 300 and may contain programs for depositing drops on several different types of circuit boards or other substrates in addition to the flip chip integrated circuit substrate discussed above.

The vision system 130 is used for providing proper alignment of the pump and dispenser 110 with the circuit board 300 prior to the dispensing of drops onto the circuit board. The vision system 130 locates fiducial points, chips, chip edges or other recognizable patterns on the circuit board in order to properly align the pump and dispenser assembly with the circuit board. The vision system may also used after dispensing has occurred to inspect the material that has been deposited onto the circuit board (or some other substrate) to ensure that the proper amount of material has been deposited, and to ensure that the material has been deposited at the proper locations on the circuit board.

Figure 3:
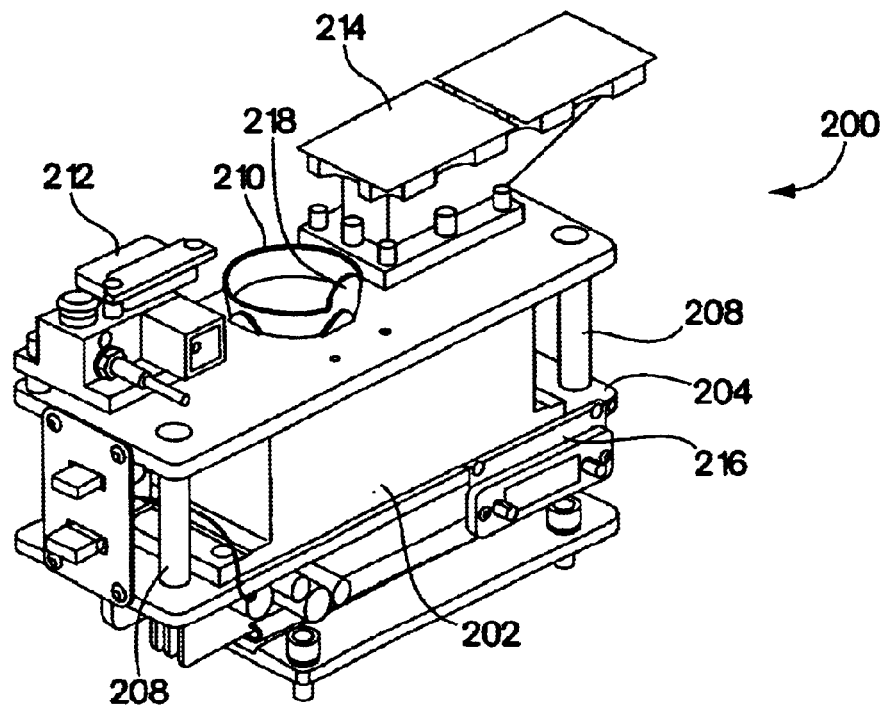
FIG. 3 is a perspective view of an apparatus used to measure weight of dispensed material in the dispensing system of FIG. 2.

The weight measuring apparatus 200 used in one embodiment of the present invention is shown in greater detail in FIG. 3. The weight measuring apparatus includes a weigh scale module 202 mounted between a bottom plate 204 and a top plate 206. Standoffs 208 support the top plate 206 above the bottom plate 204. A weighing dish 210 is coupled to the weighing module through a hole (not shown) in the top plate 206. The weighing dish is isolated from the top plate 206. Mounted on the top plate 206 are a needle calibration assembly 212 and a pre-dispense station 214.

The needle calibration assembly is used to calibrate the height of the needle tip to allow the dispensing system to adjust the tip of the needle to the proper height above a substrate for dispensing. The pre-dispense assembly provides a surface onto which material may be dispensed from the pump during, for example, initial calibration and set-up.

In one embodiment of the present invention, the weigh scale module 202 is implemented using model no. XX46-0001 available from Sartorius of Edgewood N.Y. The weigh scale module has an electrical connector 216 for coupling to the computer control system to provide weight signals to the computer control system.

During a calibration routine of dispensing systems of the present invention, material is dispensed into the weighing dish, the weigh scale module determines the weight of the material dispensed and the weigh scale module communicates electrical signals representative of the weight measured to the computer control system. In one embodiment, the weighing dish has a tab 218 that is used as a handle to lift the dish from the system for cleaning.

Figure 4:
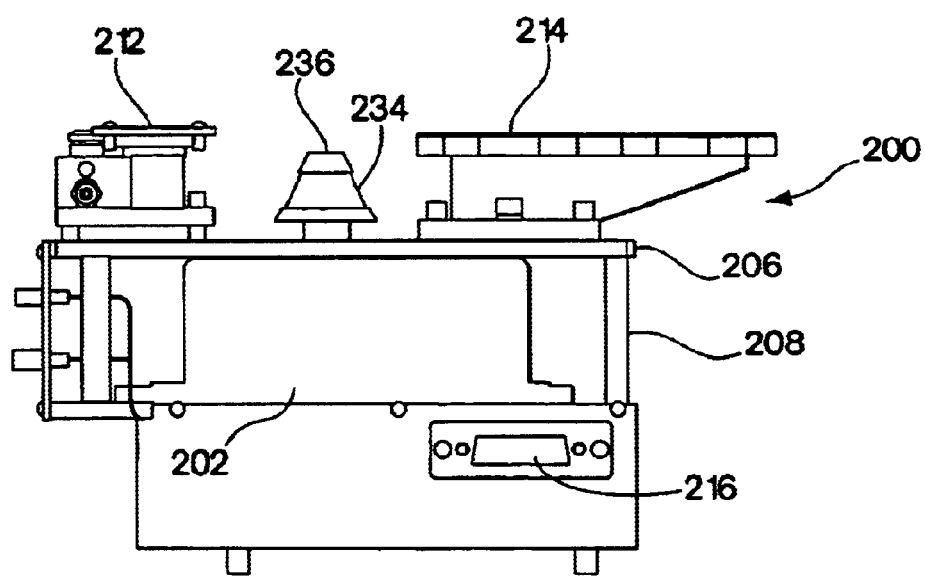
FIG. 4 is a side view of the apparatus used to measure weight of dispensed material in accordance with one embodiment of the present invention.
Figure 5:
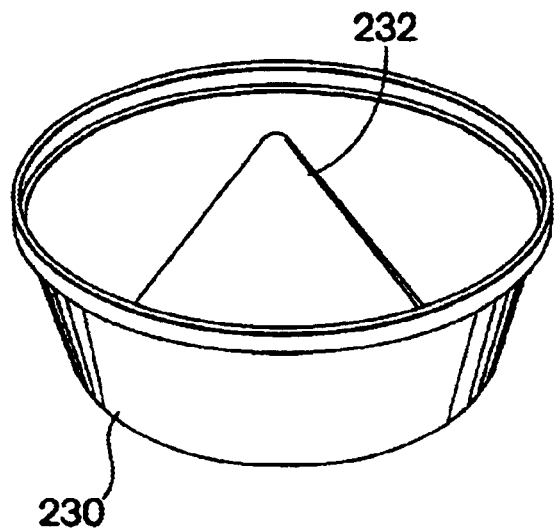
FIG. 5 is a perspective view of a weighing dish in accordance with one embodiment of the present invention.
Figure 6:
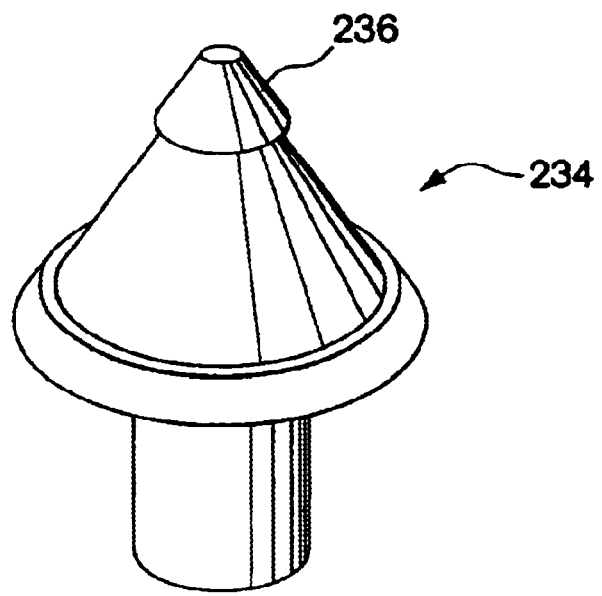
FIG. 6 is a close up perspective view of the pedestal assembly of the apparatus used to measure weight of dispensed material of FIG. 4.

FIGS. 4 through 6 show another embodiment of the present invention, wherein the weight measuring apparatus 200 employs a weighing dish 230 that has a protuberance, such as a raised center portion 232. In this embodiment, the dispensing system may move the needle past the center portion 232 to cause any tail of material on the needle to be captured in the dish for measurement. A conically shaped pedestal 234 may be mounted to the weigh scale module 202 for removably mounting the weighing dish 230 to the weight measuring apparatus 200. This configuration helps to prevent the weighing dish 230 from becoming dislodged during a calibration routine.

For purposes of illustration only, and not to limit generality, the present invention will now be explained with reference to a dispensing system employing a weight measuring apparatus for determining a quantity of dispensed material. One skilled in the art will appreciate, however, that embodiments of the present invention are not limited to weight measuring devices. It is contemplated that the quantity of material collected for measurement may be determined by methods other than weighing the material, such as by measuring its volume.

In this embodiment, a top end 236 of the pedestal 234 is congruently shaped to the center portion 232 of the weighing dish 230. Although the weighing dish 230, as shown, has a centrally located conically shaped raised portion 232, other shapes for weighing dishes and pedestals are contemplated, whereby a tail of material on the needle could be removed and captured by the weighing dish for measurement.

In this and other embodiments of the present invention, the weighing dish may be fabricated from a disposable material, such as rigid PVC film. In certain embodiments, the dish may be fabricated from Aluminum or conductive plastic, thereby minimizing any electrostatic charge build-up during operation. Otherwise, if electrostatic charges are allowed to build, electrostatic forces might be transferred to the dish during operation, which might significantly interfere with measuring the weight of the dish and its contents.

Often the material collected in the weighing dish will cure unassisted over time. In many instances, however, the material may need to be heated to assist or effect curing. In these instances the weighing dish should be able to withstand being heated to the desired cure temperature. Often weighing dishes fabricated from rigid PVC will suffice, however, the weighing dish may be fabricated from other materials that will withstand higher temperatures.

In certain other embodiments of the present invention, a container assembly (not shown), which may be similar to the weighing dish 232, may be employed as a purge station (not shown), to allow the pump to be purged of old material, air bubbles or similar undesired material and to collect such material for disposal.

In one embodiment of the present invention, the dispensing pump is driven as a fully servoed axis. This allows coordination of the pump auger rotation with the traverse motion of the dispenser valve positioning system. For example, during the dispensing of material around the perimeter of a flip chip, as the gantry accelerates out of a turn, so too does the pump. In this manner, a controlled material amount per distance traveled can be provided.

In embodiments of the present invention, the ratio of pump auger rotation to the horizontal distance traversed is defined as "Line Width", and this ratio is represented in units of degrees of auger rotation per distance traveled (e.g. deg/mm). In other embodiments of the present invention, pumps other than auger pumps, such as piston pumps or other positive displacement pumps may be used. In these embodiments, the concept of line width may be more broadly defined as the ratio of the amount of material dispensed per distance traveled.

To control the amount of material dispensed, in embodiments of the present invention, an entire dispensing pattern is used during a calibration routine. Rather than measuring a dispense rate and extrapolating this rate to predict a pattern weight, as is done in the prior art, in embodiments of the present invention, the entire pattern is weighed and compared with the target weight. In this manner, all of the nonlinear effects of starts and stops of the pump and the gantry system are accounted for in any calibration weight measurements. Finally, when adjustments are made to compensate for discrepancies between measured and desired target weights, it is the line width ratio that is varied. It should be noted, that in some embodiments of the present invention, the maximum RPM of the auger is limited, and therefore, the maximum traverse speed is varied to cause the desired target weight to be dispensed. If the maximum traverse speed were limited instead, the maximum RPM could be varied to control the weight dispensed. Alternatively, in other embodiments, both the traverse speed and the RPM of the auger could be varied to cause the desired weight to be dispensed.

One specific process for calibrating a dispensing system will now be described. Before dispensing the actual sample to be weighed, the needle of the dispensing system is moved over the sample dish and a small amount is dispensed. This initial dispense may cause a small tail of material to form on the end of the needle. While it is not necessary to perform this initial dispense, in some embodiments, it is desirable to do so, since it may be more representative of the situation that occurs at the termination of the calibration dispensing operation. After the initial material is dispensed, the scale is zeroed out. Next, using some initial line width as a starting point (e.g. 120 deg/mm), the full dispensing pattern is dispensed into the sample dish. At the end of the dispensing, a tail of dispensing material may again be formed on the end of the dispensing needle. This tail of material remaining at the end of the sample dispense should be substantially the same as the tail that was established before the sample, and accordingly, the material landing in the dish is substantially equal to the actual amount that flowed through the needle.

The sample is weighed (e.g. 160 mg), and compared to the target weight and tolerance range (e.g. 200 mg±2%). The target weight is divided by the actual weight to determine an adjustment ratio (e.g. 200 mg/160 mg=1.25), and this ratio is multiplied by the line width used during the sample dispense to arrive at a new line width (e.g. 1.25*120 deg/mm=150 deg/mm). The sample weighing and adjustment process is repeated until the sample weight is within the target range. Since the amount of material delivered is very linearly related to the line width, this converging process is typically quick in embodiments of the present invention. Usually the second sample will be within the range, however, in some cases, it may be necessary to make additional passes. Once a line width is found that achieves the desired target weight, the system may move the pump to a "pre-dispense plate" to dispense a programmable pattern of lines or dots on the pre-dispense plate. This pre-dispense pattern may be programmed to be representative of the terminal portion of the actual dispense pattern, particularly with respect to the dispense height and retraction movements, and therefore, the tail remaining on the needle after the pre-dispensing should be the same as that encountered during dispensing on actual parts. The system is then ready to dispense onto actual parts. The frequency of calibration runs can vary in embodiments of the present invention depending upon the accuracy and repeatability desired as well as the type of material being dispensed.

Another process for calibrating a dispensing system, which accounts for the tail of dispensing material created during a dispensing operation, will now be described. In this process, the pump is moved over a dish having a protuberance. Next, a small amount of material is dispensed, thereby forming a tail of material on the dispensing element. The tail of material is then dislodged from the dispensing system and collected in the dish by moving the pump over the protuberance such that the tail of material contacts the protuberance. After the tail is dislodged, the scale is zeroed out. As previously described, the fall dispensing pattern is then dispensed into the dish according to a predetermined dispensing pattern. At the end of the dispensing operation, the tail of dispensing material left on the end of the dispensing needle is dislodged and collected in the dish, and accordingly, the material landing in the dish is substantially equal to the actual amount that flowed through the needle. The quantity of dispensed material, including the tail material, is then determined and compared with a target quantity. If the difference between these quantities is greater than a predetermined tolerance, the dispensing system is adjusted, as above described, until the difference is less than the tolerance.

In certain embodiments of the present invention, when pattern samples are being dispensed into the weighing dish, a special scaling algorithm is used to keep the needle over the dish. This algorithm is particularly useful for large dispensing patterns. For large patterns, without the scaling provided in embodiments of the present invention, the extent of movement during the pattern (e.g. 25 mm) would typically cause the needle to move away from the center of the dish.

In one embodiment, during the calibration dispensing operation, the X-Y distances and velocities of the original pattern are both scaled down by a factor of 100 (e.g. 25 mm/100=0.25 mm), and the line width is scaled up by the same factor (e.g. 100*150 deg/mm=15000 deg/mm). It can be easily observed that the two scaled factors will cancel each other out, causing the pump to follow the same velocity profile as it would during a non-scaled dispense (e.g. 25 mm*150 deg/mm=3750 deg=0.25 mm*15000 deg/mm).

This scaling allows the sample dispensing routine to run using the identical software code that is used to perform real dispensing. During the calibration routine, the coordination between X-Y movement and dispensing from the pump is maintained, as are all of the starts, stops and acceleration/deceleration profiles. Accordingly, the non-linearities associated with the starting and stopping of the pump and the gantry motors are accounted for during the calibration routine to provide a more accurate calibration and control routine. In other embodiments of the invention, rather than scale the movement and the speed of the pump during a calibration routine, the dispensing pump is controlled to follow the same dispensing pattern that is used to dispense on substrates (e.g., the same acceleration and deceleration profiles) while the pump is held in a fixed position over the weigh scale.

In the embodiments described above, a scaling algorithm is used to allow the full dispensing pattern of the pump to be run during a weight calibration. In other embodiments of the present invention, the scaling algorithm and full pattern calibration dispensing technique may be used with dispensing systems having other measurement devices, such as a volumetric measurement device, that provide calibration based on the volume of material dispensed, such as the dispensing systems described in U.S. Pat. No. 6,112,588, assigned to the assignee of the present invention and incorporated herein by reference.

In embodiments of the present invention described above, a system controller controls the operation of the components of the dispensing system. In other embodiments, some or all of the functions of the system controller may be distributed among the various components of the dispensing system. For example, an intelligent weigh scale may be used having processing capabilities contained therein for comparing a measured amount with a target amount and outputting a signal indicative of a difference between the measured and target amounts.

In embodiments of the present invention discussed above and in the claims, the term weight scale is used to refer to a device for determining the weight of material dispensed. The term weight scale is intended to include both weight scales and balances that are used to measure weight and/or mass of material.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A dispensing system for dispensing a material onto a substrate, the system comprising:
   a dispensing element having a metering device that controls a quantity of the material dispensed from the dispensing element to the substrate; and
   a calibration device to calibrate the quantity of material dispensed having a dish that receives the material from the dispensing element during a calibration routine of the dispensing system, the dish including a conical protuberance extending from a center portion of the dish.

2. The dispensing system of claim 1 further comprising a frusta-conical pedestal, coupled to the calibration device, for supporting the dish while the dish receives the material from the dispensing device.

3. The dispensing system of claim 2 wherein the dish includes an annular trough portion surrounding the conical protuberance, and wherein the protuberance is substantially centered in the annular trough.

4. The system of claim 2, wherein the dish is removably connected to the calibration device.

5. The system of claim 2, wherein the dish further includes a tab for conveying the dish to or from the calibration device.

6. The system of claim 2, wherein the protuberance operatively removes an amount of the material dispensed from the dispensing element during the calibration routine.

7. The system of claim 2, wherein the dish is disposable.

8. The system of claim 2, wherein the dish will withstand a temperature that will allow an amount of the material collected in the dish to cure.

9. The system of claim 2, wherein the dish is fabricated from a generally conductive material.

10. A dispensing system that dispenses a material onto a substrate according to a dispensing pattern, the dispensing system comprising:
    (a.) a gantry system;
    (b.) a dispensing pump, coupled to and movable on the gantry system, to dispense a quantity of the material having a tail of the material and constructed and arranged to follow a calibration pattern that is representative of the dispensing pattern;
    (c.) a calibration system having a dish, the calibration system constructed and arranged to collect the quantity of material dispensed from the pump during the calibration pattern in the dish, measure the amount of the material, and compare the amount of the material with a target quantity,
       wherein the dish comprises a protuberance such that the pump and the dish move relative to one another, and as the pump passes the protuberance, the tail of the material contacts the protuberance and the dish collects the dislodged tail of material for measurement by the calibration system; and
    (d.) a controller to adjust characteristics of the dispensing system when a difference between the measured material and the target quantity is greater than a predetermined tolerance.

11. The dispensing system of claim 10 wherein the calibration system is constructed and arranged to repeat a calibration routine prior to dispensing on a substrate until the difference between the measured material and the target quantity is less than the tolerance.

* * * * *